US005214000A

United States Patent [19]
Chazan et al.

[11] Patent Number: 5,214,000
[45] Date of Patent: May 25, 1993

[54] THERMAL TRANSFER POSTS FOR HIGH DENSITY MULTICHIP SUBSTRATES AND FORMATION METHOD

[75] Inventors: David J. Chazan, Palo Alto; Gary R. Weihe, Fremont; Richard F. Otte, Los Altos Hills, all of Calif.

[73] Assignee: Raychem Corporation, Menlo Park, Calif.

[21] Appl. No.: 810,224

[22] Filed: Dec. 19, 1991

[51] Int. Cl.$^5$ .................................. H01L 21/60
[52] U.S. Cl. .................................. 437/209; 437/180; 437/195; 437/211
[58] Field of Search ............... 437/180, 195, 209, 211; 357/81; 228/180.2

[56] References Cited

U.S. PATENT DOCUMENTS

| | | | |
|---|---|---|---|
| 4,803,450 | 2/1989 | Burgess et al. | 228/180.2 |
| 5,043,297 | 8/1991 | Suzuki et al. | 437/195 |
| 5,048,166 | 9/1991 | Wakamatsu | 228/180.2 |
| 5,063,175 | 11/1991 | Broadbent | 437/195 |
| 5,102,829 | 4/1992 | Cohn | 437/211 |
| 5,106,461 | 4/1992 | Volfson et al. | 437/180 |

OTHER PUBLICATIONS

Keeley et al., "Achieveing a Balance of Thermal Performance and Routing Density in a Multichip Module Substrate," Proc. Techn. Prog. Nat. Electron. Packaging & Production Conf. (NEPCON-East 1991), pp. 551–561 (Cahners Exposition Group, Des Plaines, Ill., 1991).

Advance Packaging Systems brochure entitled "Reliability Report-High Density Interconnect Multichip Module Substrates" pp. 1–16 date unknown.

Primary Examiner—Brian E. Hearn
Assistant Examiner—Kevin M. Picardat
Attorney, Agent, or Firm—Yuan Chao; Herbert G. Burkard

[57] ABSTRACT

Thermal post vias are formed within a formed multilayer, high density interconnect including a base and plural layers of metal conductors separated by dielectric material by the steps of:
removing in a single step dielectric material at predetermined sites of the thermal post vias to define substantially cylindrical post holes, and
forming the thermal post vias by emplacing conductor material, such as metal, into the post holes so that the material fully occupies and fills up the holes.

9 Claims, 8 Drawing Sheets

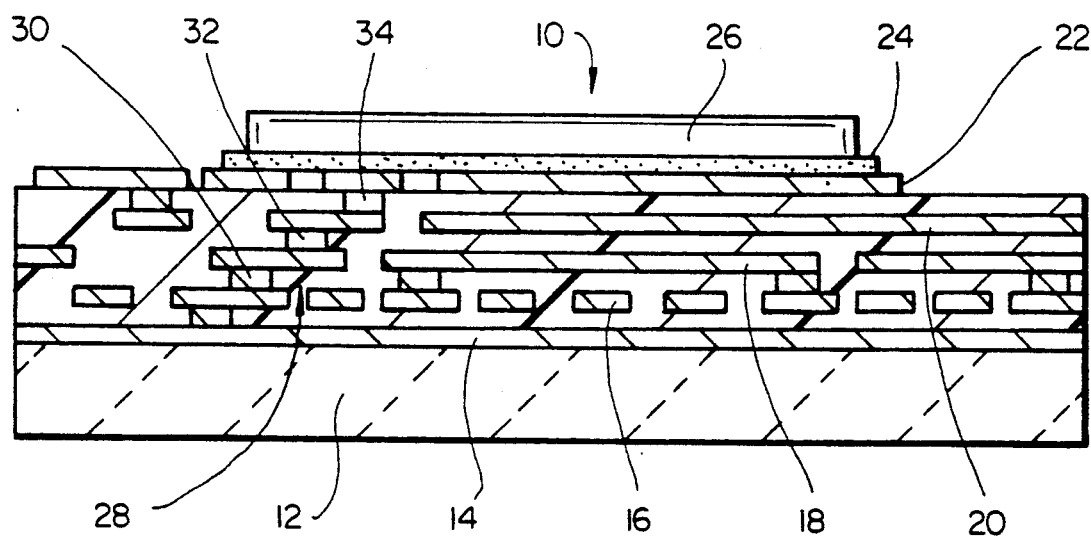
FIG_1
(PRIOR ART)
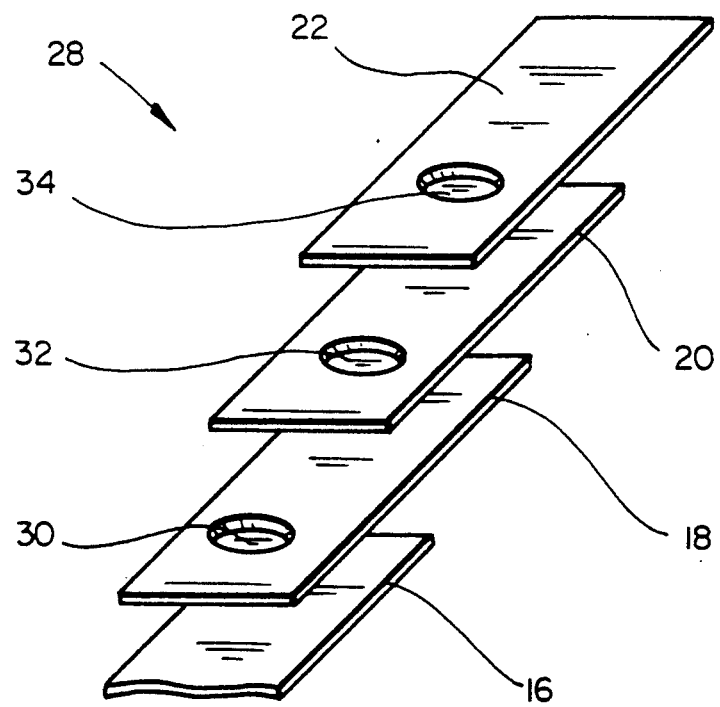
FIG_2
(PRIOR ART)

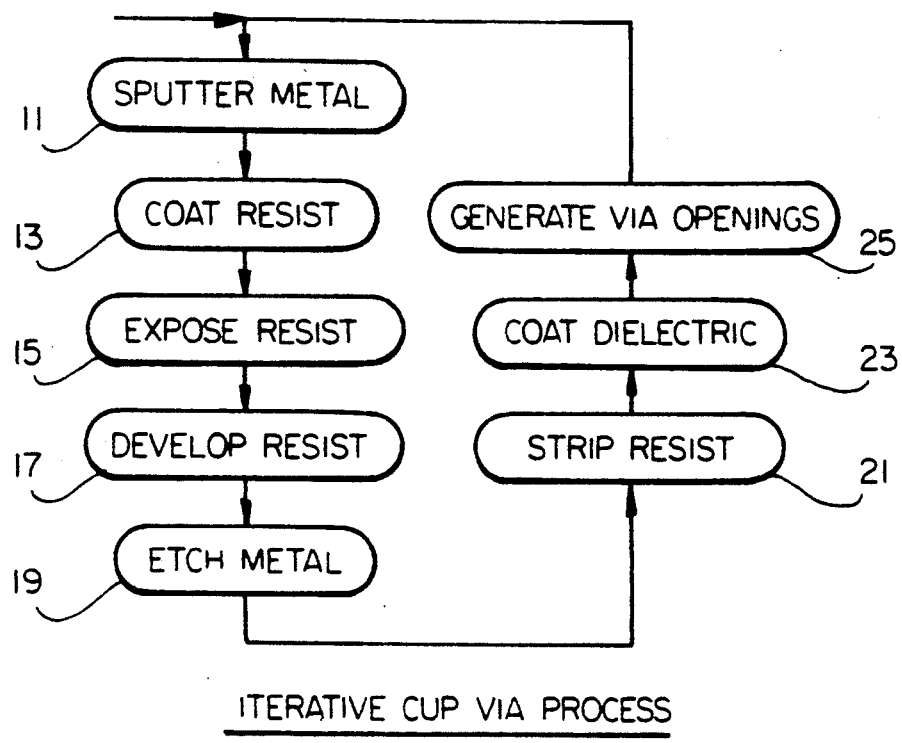
FIG_3
(PRIOR ART)
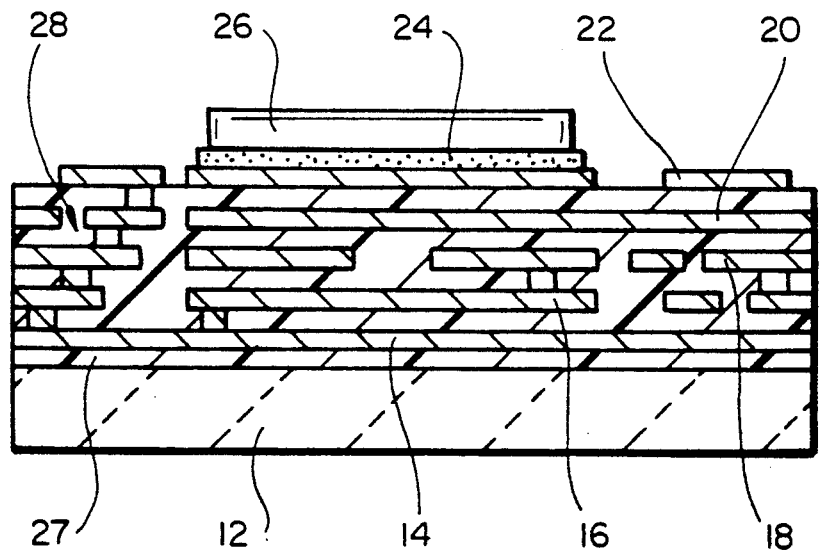
FIG_4
(PRIOR ART)

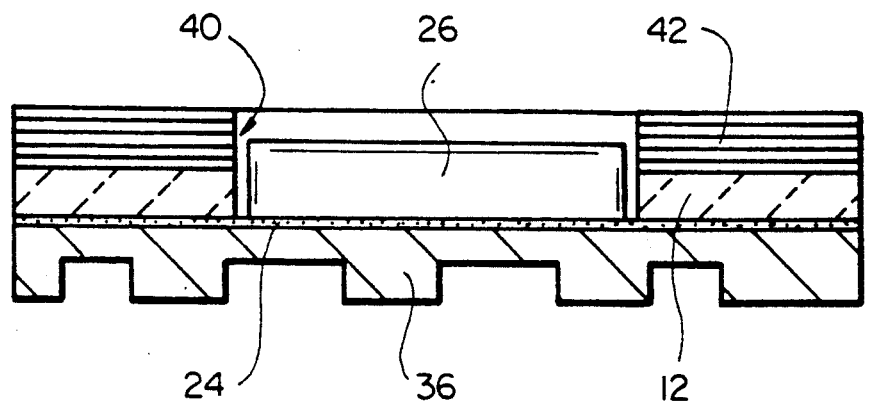
FIG_5
(PRIOR ART)
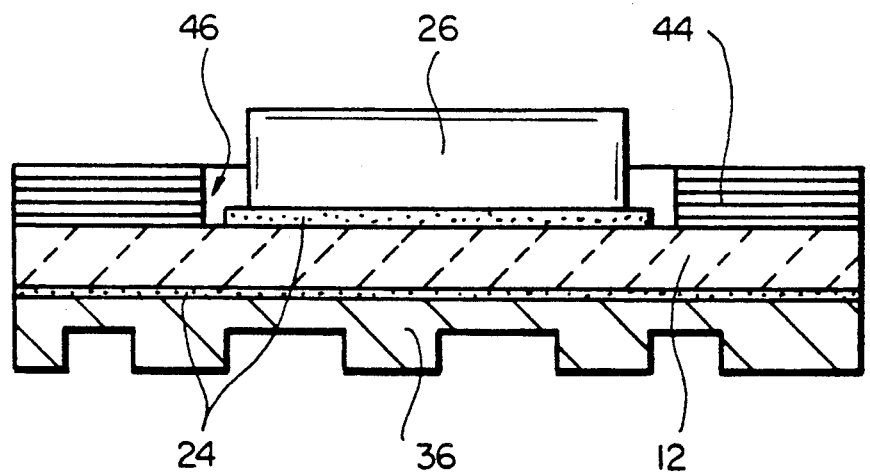
FIG_6
(PRIOR ART)

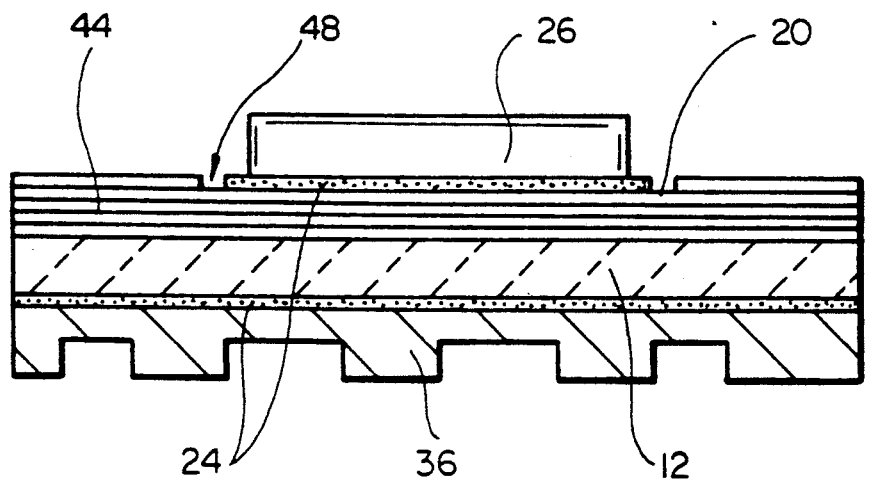
FIG_7
(PRIOR ART)
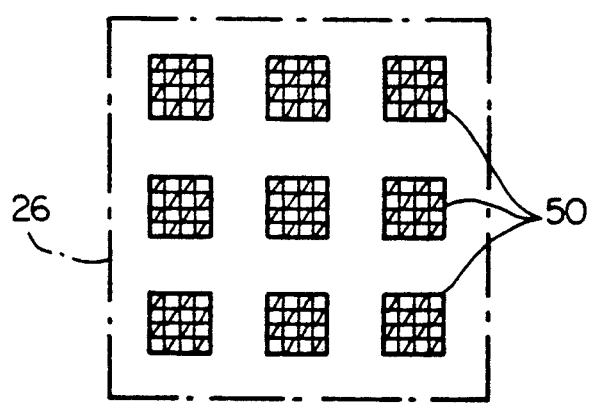
FIG_8
(PRIOR ART)

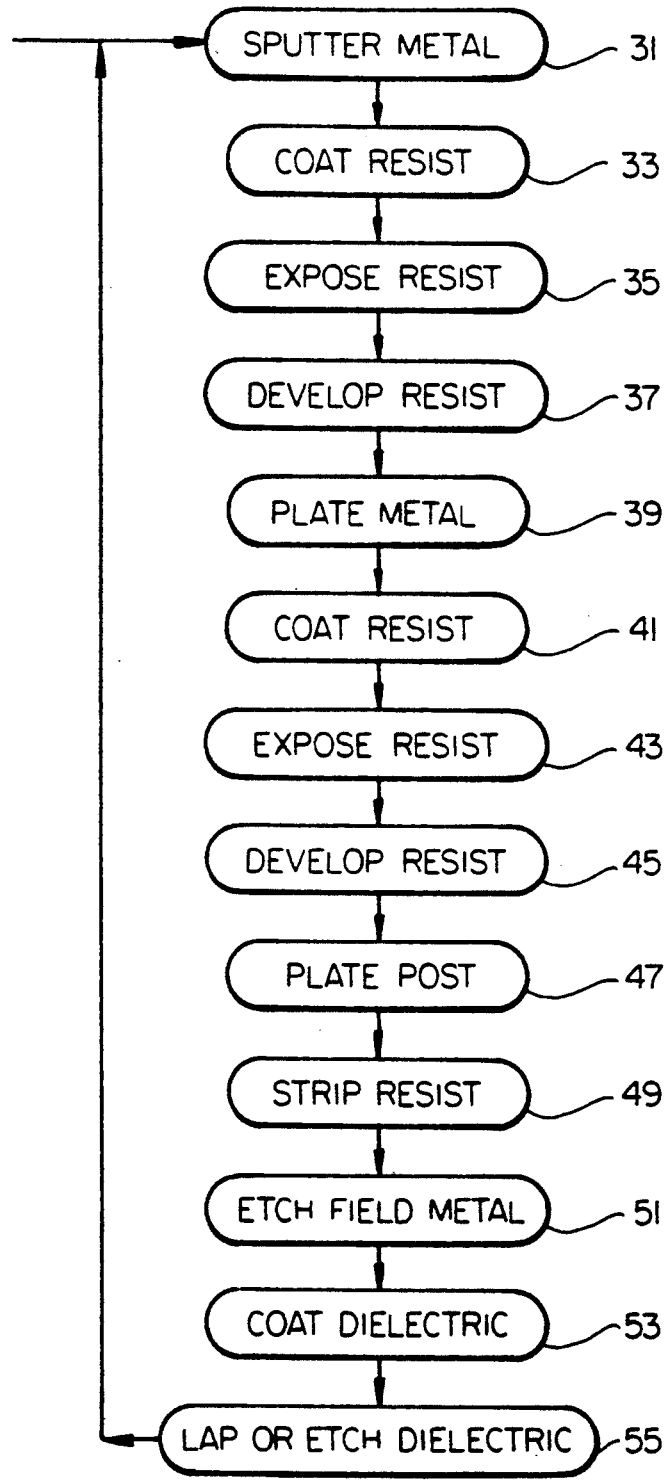
ITERATIVE POST VIA PROCESS
FIG_9
*(PRIOR ART)*

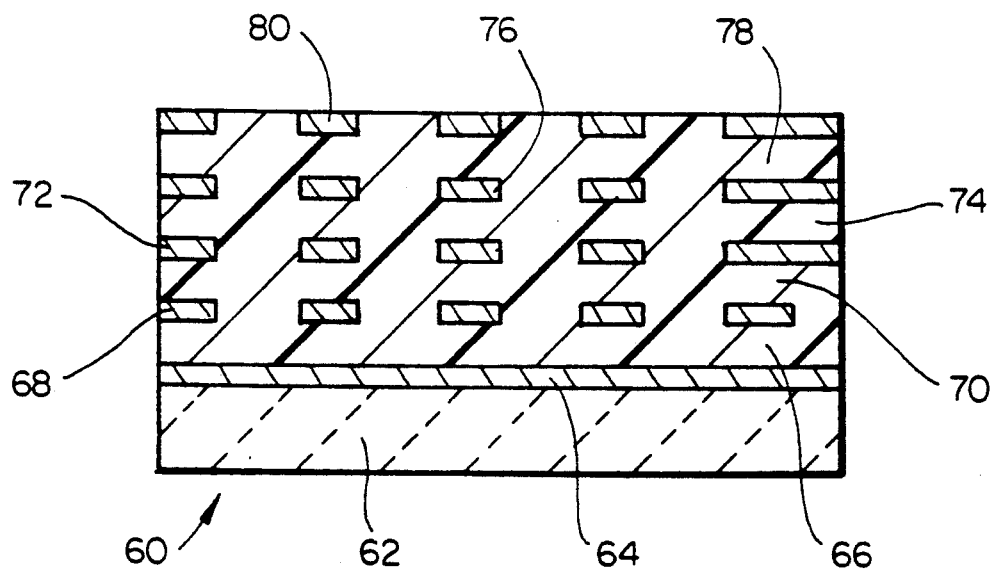
FIG_10
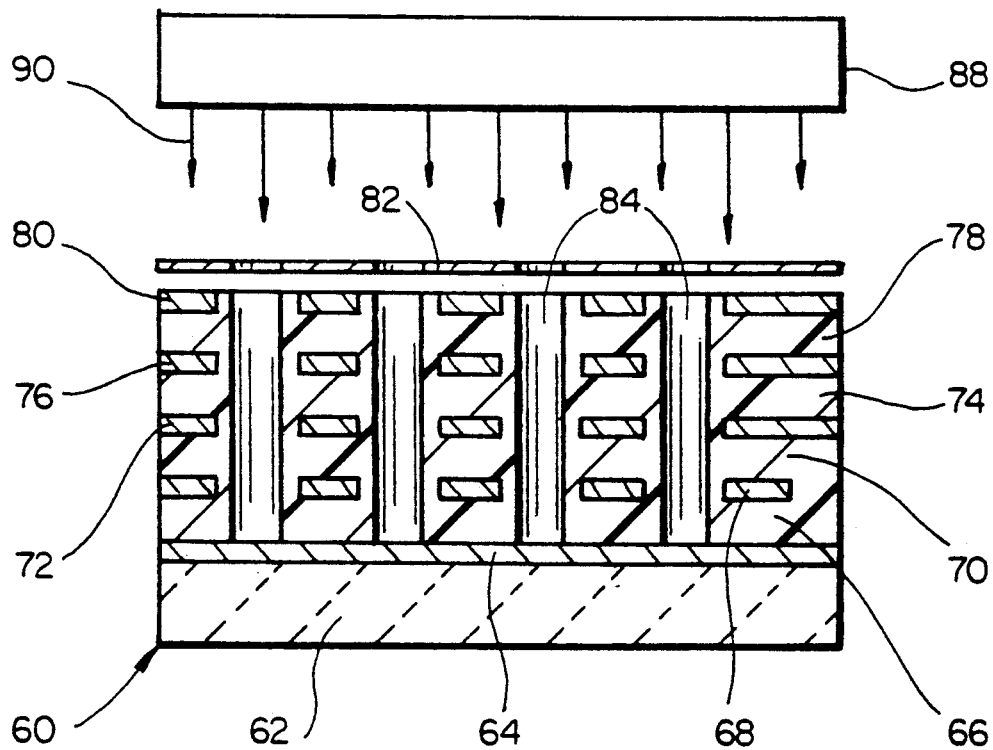
FIG_11

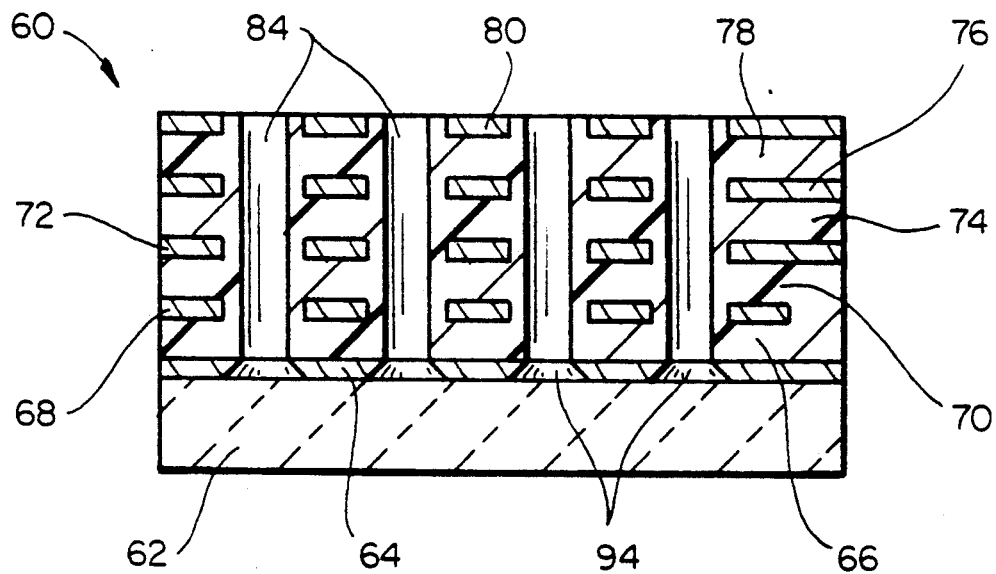
FIG_12
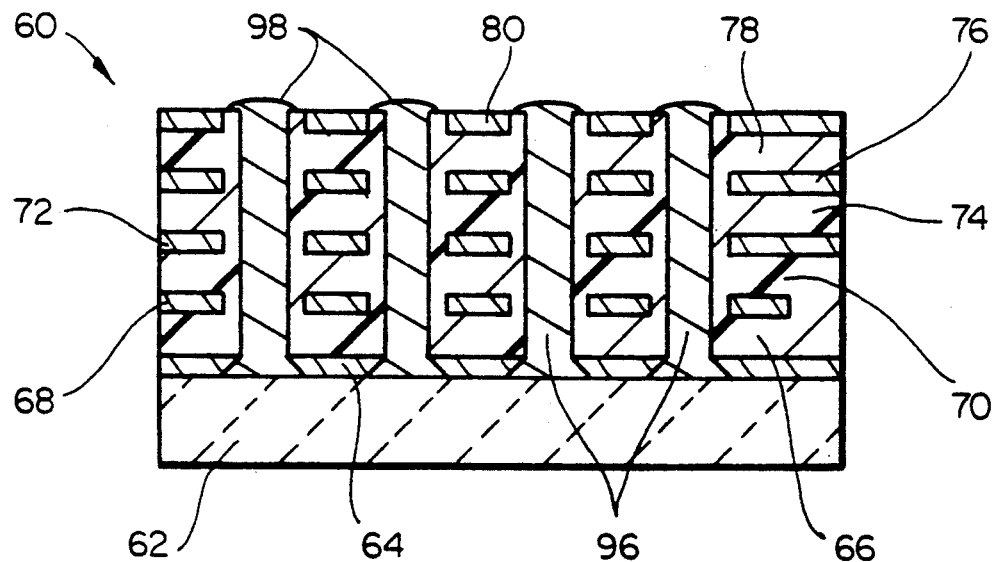
FIG_13

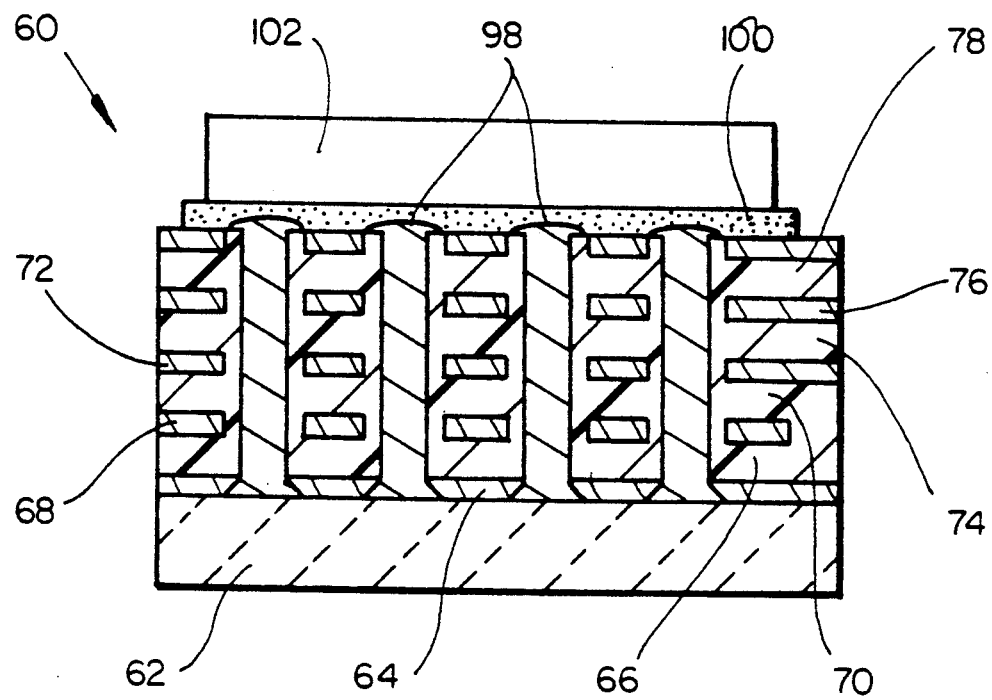
FIG_14
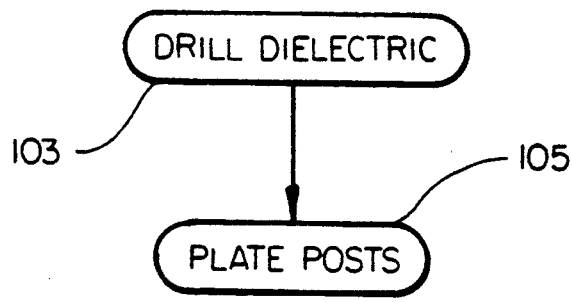
FIG_15

THERMAL TRANSFER POSTS FOR HIGH DENSITY MULTICHIP SUBSTRATES AND FORMATION METHOD

FIELD OF THE INVENTION

The present invention relates to methods for forming thermal transfer posts for conducting heat between an integrated circuit chip mounted on and connected to a high density interconnect substrate.

BACKGROUND OF THE INVENTION

Multi-layer thin film high density interconnect structures for interconnecting integrated circuit chips provide many apparent advantages to the electrical circuit designer. The high density interconnects provide very tight packaging of the circuit chips with shorter external conductor paths and resultant improvements in signal path speeds. However, as interconnect path densities increase at the substrate, difficulties arise in conducting heat generated within the integrated circuit chip during its operation to the substrate (or to a metal plane formed on the substrate) from which it may then be carried away or dissipated by a heat sink, etc.

High density interconnects are multi-layer, very fine feature printed circuit boards which are typically fabricated by using techniques employed in the manufacture of the integrated circuit chips themselves. In one typical arrangement, the interconnect structure will include a substrate of thin film ceramic, crystalline silicon, or metal upon which multiple layers of thin film conductors are formed. The conductors within a particular layer, and the conductors from layer to layer, are separated by a polymer dielectric, such as polyimide. A continuous ground plane layer of metal is typically deposited onto a planarized thin film substrate.

Following formation of the metal ground plane layer, alternating layers of polymer dielectric and thin film metal conductors are laid down (typically forming e.g. x-dimension signal plane layer, y-dimension signal plane layer, power plane layer and top metal layer). The metal conductors are conventionally patterned with photolithographic techniques including applying a metal plane, and then applying, patterning and developing a photoresist in order to pattern the metal plane.

One increasingly popular form of high density interconnect structure is known as a multichip module. A multichip module is one form of hybrid circuit and comprises a single substrate to which two or more integrated circuit chips are mounted and interconnected. In order to minimize the size of the module, it is desirable to mount the circuit chips on top of the multilayered support substrate in a manner wherein at least some of the signal and power paths lie under the chips.

In many multichip module applications heat generated by the integrated circuit chips is conducted out to and through the thin film substrate. The substrate also supports a multilayer structure which provides the electrical signals and power. This particular heat and electrical flow arrangement presents a difficult and hitherto costly challenge to the multichip module designer because of the nature of the dielectric insulation that is used to isolate the interconnect path conductors. In most prevalent multichip module applications a polymer such as polyimide is used as the insulating dielectric. Unfortunately, polymers are very poor thermal conductors.

It is essential to remove heat from operating integrated circuit chips in order to prevent chip feature and to maintain and extend the lifetime of these devices. In many multichip module applications, high signal routing densities in the multiple layers underneath the chip block the heat path between the chip and the substrate. If thermal conductor paths are provided through the multilayer interconnect to the substrate in order to provide requisite heat transfer through the non-conductive polyimide layers, these thermal conductor paths necessarily limit the signal routing channels otherwise available for conductive paths directly under the chip from which heat is being transferred.

Thermal vias are typically used to conduct heat through the insulative layers of the high density interconnect directly under the integrated circuit chip. The effectiveness of a thermal via is dependent in large measure upon the type of via employed for thermal conduction. In turn, the thermal via is dependent upon the processing method employed to fabricate the multilayer thin film interconnect structure.

There are two general types of fabrication processes which have been used to form vias, whether for thermal or electrical conduction (or both), in high density interconnect layers: staggered conformal vias, and thermal post plate-up vias formed on an iterative (step-by-step) basis with a number of separate process steps occurring at each metal layer of the multilayer structure. Both processes have employed plural steps at each layer which are repeated at the next layer, and so on. Thus, these prior processes are referred to herein as "iterative" processes.

The staggered conformal vias method relies upon patterning holes in the dielectric layer, followed by a metallization step over the exposed and patterned substrate and down into the dielectric holes to make the vertical interconnections or vias between adjacent metal layers. The vias formed by this process are conformal or "cup-like". These vias are conventionally used for electrical conduction, and they have likewise been used for thermal conduction as well.

FIGS. 1 and 2 illustrate in greatly enlarged, highly diagrammatic views a five conductor layer high density interconnect structure 10 formed in accordance with the prior art. The structure 10 includes a thin film substrate 12 which may be of ceramic, semiconductor grade crystalline silicon, or metal. A thin film ceramic substrate 12 is shown in FIG. 1. Alternating layers of polymer dielectric and metal conductors are formed on the substrate 12. There are five such layers shown in FIG. 1: a ground plane layer 14 formed directly upon the substrate 12, an X-dimension signals layer 16 above the ground plane 14, a y-dimension signals layer 18 above the X-dimension signals layer 16, a power plane layer 20, and a top metal layer 22. A thermally conductive cured epoxy layer 24 secures a semiconductor integrated circuit chip 26 to the top metal layer 22.

As outlined in the FIG. 3 process flowchart, a multilayer staggered conformal via formation 28 may be formed iteratively to provide a thermal conductor path from the chip 26 downwardly through each metal layer 22, 20 18, 16, 14 to the substrate 12. The metal layers are typically defined by the steps of depositing a thin film metal layer e.g. by sputter deposition, at a step 11. A resist layer is then coated (e.g. by spin coating) at a step 13. The coated resist is then exposed (patterned) at a step 15 and developed at a step 17 to expose portions of the metal layer to be removed. The metal layer is then patterned by etching e.g. with a wet chemical etch at a step 19, after which the resist residue is removed at a step 21. A subsequent layer of dielectric is then deposited at a step 23. Via openings are defined in the newly deposited layer at a step 25, and this process is then reiterated for the next metal layer at the step 11.

Each metal layer is separated by a polymer dielectric which has been coated (e.g. by spin coating) and cured. Interconnections between the layers are thus accomplished by forming cup like conformal vias 30, 32 and 34, as described hereinabove. A principal drawback of the FIGS. 1-3 approach for thermally connecting the chip 26 to the substrate 12 through the formation 28 is that the formation 28 is staggered; i,e it requires considerable space at each metal layer in order to provide for a staggered connection to the layer above it, and to the layer below it, thereby encroaching into otherwise available routing channel space under the chip 26.

FIG. 4 illustrates in cross section and greatly enlarged elevational view another typical five layer high density structure like the structure 10 shown in FIG. 1, except that a planarizing layer 27 of coated polymer material is placed on the substrate 12 and further thermally isolates it from the chip 26. In this example, no metal conductor direct thermal paths are provided from the chip 26 to the substrate 12, and this prior approach accordingly represents a least desired approach for transferring heat from the chip 26 to the substrate 12.

In the prior art cooling methods, heat from a multi-chip module is typically dissipated to the ambient by a convection heat sink 36 attached to the underside of the substrate 12. One prior approach to improve thermal conductivity between the chip 26 and the ambient is simply to define a well 40 through a high density interconnect structure 42 to enable the integrated circuit die 26 to be mounted in direct thermal contact with a heat sink 36, as shown in FIG. 5. It is manifestly evident that the drawback presented by the FIG. 5 approach is the total elimination of any conductive layer routing channel paths extending directly beneath the chip 26. With the FIG. 5 approach, all of the signal and power paths must be routed completely around the well 40, thereby greatly extending the required size of the multi-chip module 42 for a given number of interconnect paths.

Another approach found in the prior art is to provide a thermal well extending through all of the high density interconnect metal and dielectric layers to the substrate 12. This approach is illustrated in FIG. 6 wherein the high density interconnect layers 44 are interrupted by a well 46 which extends to the substrate 12. In this prior example, the integrated circuit chip or die 26 is mounted in the well 46. As with the FIG. 5 approach, the FIG. 6 approach eliminates all interconnects from being directly under the chip 26 and likewise requires a much larger multi-chip module for a given functionality.

A high density interconnect 44 defining a partial thermal well 48 is shown in FIG. 7. In this approach, the integrated circuit chip 26 is attached to the power plane layer 20 by a thermally conductive epoxy layer 24. While moderate heat loads may be transferred to the substrate by thermal conduction, heat transfer remains inefficient with this approach.

The FIG. 8 plan view illustrates a prior approach employing via island arrays 50 of blind staggered thermal conduction vias, such as the via structure 28 of FIGS. 1 and 2. These arrays 50 provide some further improvement in heat transfer between the chip 26 and the substrate 12 while leaving some room for conductive traces at the X-dimension level 16 and y-dimension level 18. However, the fact that the thermal path of each structure 28 is staggered from layer to layer limits the practical density of the vias within the island arrays 50 and therefore the amount of heat that may be conducted directly to the substrate.

While staggered conformal vias are conventionally used to provide interlayer electrical and thermal conduction paths, greater thermal efficiency has resulted from plating up the vias to form a solid metal thermal post which transfers heat directly between the chip and the substrate. Accordingly, the second or post-plate-up vias method relies upon e.g. an iterative electroplating process in order to plate up conductors as solid posts at locations defined by a temporary photoresist pattern at each layer. The problem with forming post-plate-up vias on a step by basis is that this process requires a number of separate steps at each layer.

To elaborate, in forming a post at a particular layer a metallization planar layer is formed. The metallization layer is then coated with a photoresist. The photoresist is then patterned and selectively removed along with the underlying metal, leaving metal post plateaus. A polyimide is then coated onto the structure to fill in the voids between the metal post plateaus, and usually overcoats the plateaus as well. Any overcoat must then be removed by micromachining techniques, such as a lapping process which removes several microns of the polyimide overcoat, or a gross plasma etch system which burns off a requisite depth of the polyimide overcoat. Irrespective of the removal technique, the top surface of the metal post must be exposed before the next layer may be formed by plating-up from that surface.

These iterative post plate-up steps are summarized in FIG. 9. The iterative post via process of the prior art begins at each metal layer with a metal deposition step 31. A photoresist is then coated onto the metal layer at a step 33. The resist is then selectively exposed to light energy at a step 35, and developed chemically at a step 37. Metal is then plated upon the developed resist at a step 39. Resist is then coated upon plated metal at a step 41 and exposed at a step 43. The resist is then developed at a step 45, and an increment of the metal post is plated at a step 47. The resist is then stripped away at a step 49. The field metal is then etched away at an etch step 51. Dielectric is then coated onto the resultant structure at a step 53, and is then lapped or etched at a step 55. This process then repeats at the next metal layer to be defined.

The prior layer-by-layer process steps, while effective in forming vertical posts, are very time consuming and expensive. However, from a thermal conductivity point of view, the solid thermal post via is superior in performance to the conformal via, due to the direct thermal path available to conduct the heat away from the semiconductor die and through to the substrate (or to a metal plane adjacent to the substrate). The superior thermal conductivity of the solid post via permits higher routing channel densities under the chip without sacrificing thermal performance of the high density interconnect structure. Yet the drawback of this prior approach, namely the complexity, time and costs associated with the additional process steps required to form the solid post thermal vias, limits its attractiveness as an approach for realization of a low cost high density interconnect structure.

SUMMARY OF THE INVENTION WITH OBJECTS

A general object of the present invention is to provide a new method for forming thermal transfer post vias in a high density interconnect structure in a manner which overcomes limitations and drawbacks of the prior art.

Another object of the present invention is to provide a method for forming thermal post vias in a high density interconnect structure in a manner which reduces the number of process steps required.

A further object of the present invention is to provide a last-process-step method for forming thermal post vias as a final operation in a fabrication process for forming high density interconnects.

One more object of the present invention is to provide a method for defining a hole through a multiple layer high density interconnect structure after is has been formed and build up a metal post thermal via in the hole, thereby to realize improved thermal conductivity between an integrated circuit chip and a high density interconnect substrate.

Yet another object of the present invention is to provide a simplified and more reliable, lower cost method for forming a solid heat transfer post via within a high density interconnect which maximizes adjacent room for signal paths while still providing for efficient, effective heat transfer from a connected and operating integrated circuit chip to an underlying support substrate and an associated thermal sump.

In accordance with principles of the present invention, a simplified, non-iterative method is provided for forming thermal post vias within a formed multi-layer, high density interconnect including a base and plural layers of metal conductors separated by dielectric material. The method essentially comprises the steps of:

removing in a single step dielectric material at predetermined sites of the thermal post vias to define substantially cylindrical post holes, and forming the thermal post vias by emplacing conductor material, such as metal, into the post holes so that the material fully occupies and fills up the holes.

In one aspect of the invention, the step of forming the thermal post vias is carried out by a single metal plating process step, such as electroplating, or electroless plating accompanied by the step of chemically charging the hole prior to electroles plating up of the post vias.

In another aspect of the present invention, the step of forming the thermal post vias is carried out by the steps of depositing, e.g. by sputtering, a metal coating upon exposed walls defining said post holes to form plated holes, and placing a metal in a liquified state, such as a suitable heated solder alloy, into the plated holes, and then permitting the metal to solidify.

As a further aspect of the present invention, the step of removing in a single step dielectric material at predetermined sites of the thermal post vias to define substantially cylindrical post holes is extended to a ground plane metal layer formed upon the base, and a further step is carried out for undercutting the ground plane metal layer to define a widened space prior to the step of forming the metal post vias, so that the metal occupying the widened space anchors the metal post via within the multi-layer formation.

As yet another aspect of the present invention, the step of forming the metal post vias further comprises forming domes at upper ends thereof, domes for aiding removal of voids in a die-attach medium when an integrated circuit die is attached to the module over the thermal post vias.

As one more aspect of the present invention, the step of removing in a single step dielectric material at predetermined sites of the thermal post vias is carried out at plural predetermined via island areas underlying an integrated circuit die to be attached to the module.

These and other objects, advantages, aspects and features of the present invention will be more fully understood and appreciated by those skilled in the art upon consideration of the following detailed description of a preferred embodiment, presented in conjunction with the accompanying drawing.

BRIEF DESCRIPTION OF THE DRAWINGS

In the drawings:

FIG. 1 is a greatly enlarged sectional view of a portion of a prior art integrated circuit interconnect structure, showing how blind staggered electrical vias for interconnecting traces at separated layers of the interconnect structure may be employed as thermal vias.

FIG. 2 is an orthogonal diagrammatic view of a portion of the FIG. 1 prior art interconnect structure, showing four conductive layers interconnected together by three cup-shaped blind staggered vias.

FIG. 3 is a process flow diagram of an iterative cup via formation process in accordance with the prior art.

FIG. 4 is a greatly enlarged sectional view of a portion of a typical prior art five layer high density interconnect routing configuration.

FIG. 5 is a greatly enlarged sectional view of a portion of a prior art high density interconnect having a thermal cut out area so that the integrated circuit die may be attached directly to a heat sink for thermal sumping.

FIG. 6 is a greatly enlarged sectional view of a portion of a prior art high density interconnect including a thermal well for mounting the IC die.

FIG. 7 is a slightly modified prior art example of the FIG. 6 thermal well, showing a partial thermal well.

FIG. 8 is a greatly enlarged top plan view of a die attach region of a prior art high density interconnect, showing nine regularly spaced thermal via islands (which may be of the blind staggered via or of the post plate up via types) which permit some signal routing channels to exist between the islands.

FIG. 9 is a process flow diagram of an iterative plate-up post vias formation process of the prior art.

FIG. 10 is a greatly enlarged sectional view of a five layer multi-layer interconnect module supported on a base, formed in accordance with principles of the present invention.

FIG. 11 illustrates a drilling process by which e.g. four post holes are formed through the multiple layers of the FIG. 10 module, also in accordance with principles of the present invention.

FIG. 12 illustrates an etch-back process by which a region in a base metal layer is etched back to form an enlarged and reverse chamfered annular space at the base of each post hole, in accordance with principles of the present invention.

FIG. 13 illustrates a final-process-step post plate-up of solid metal post vias in the FIG. 12 post holes in accordance with principles of the present invention.

FIG. 14 illustrates a final assembly step by which an integrated circuit chip is attached to the module over the FIG. 13 metal post vias with a suitable die attach material.

FIG. 15 is a process flow diagram showing the simplified process for forming thermal transfer posts in accordance with the present invention.

DETAILED DESCRIPTION OF A PREFERRED EMBODIMENT

FIGS. 10 through 15 illustrate a presently preferred method for forming thermal post vias in a multi-chip module 60 employing high density interconnect techniques and structural features. In FIG. 10, a thin film alumina ceramic or silicon substrate 62 of the module includes a ground plane metallization layer 64 deposited directly thereon, as by vacuum sputtering techniques, for example.

A dielectric coating layer 66 e.g. of polyimide, is coated on top of the ground plane layer, and an x-dimension metallization layer 68 is then deposited and patterned by a photolithographic process as described above. A second dielectric layer 70 is then coated on top of the layer 68, and a Y-dimension metallization layer 72 is formed on top of the layer 70 and patterned. Layers 74, 76, 78 and 80 are subsequently formed to complete the five layer module 60.

After the module 60 has been completed, a mask 82 is placed over the module 60, and energy 90 from a suitable source 88 is directed downwardly through the mask 82 to form holes 84 extending through the polyimide layers 78, 74, 70 and 66 and passing by the spaced away metal layers 80, 76, 72 and 68. The energy 90 is selected to be such that it does not penetrate the bottom ground plane layer 64. The energy 90 may be coherent light energy generated by a laser, such as an excimer laser which puts out energy particularly effective in ablating polyimide, for example. Other micro-drilling techniques may be employed to form the holes 84 through the insulating dielectric material.

Turning now to FIG. 12, in order to assure that the solid post vias remain securely in place against the base 62, an etch back step may be employed to etch back the ground plane layer 64 at the vicinity of each hole 84, leaving behind an enlarged annular etch back space 92 with e.g. a slightly chamfered contour.

Turning now to FIG. 13, solid metal posts 96 are plated up in a single plating operation by conventional techniques. Most preferably, an electroplating operation is carried out by applying a plating bias current between the metal ground plane layer 64 and a source feeding free metal ions into a plating bath and into the holes 84. An electroless plating operation may also be employed by chemically activating the structure defining the holes 84, however the quality of metal resulting from electroless plating is not as good as that achievable with electroplating.

In FIG. 13, domes 98 are preferably formed at the upper ends of the posts 96. These domes 98 extend over the adjacent polyimide and cooperate with the metal filling the enlarged chamfered regions 94 so as to secure the posts 96 in place. They also perform an important additional function of minimizing voids (bubbles) in a die attach epoxy layer 100.

As seen in FIG. 14, the die attach layer 100 is used to secure an integrated circuit die 102 at the top of the now-completed module 60. The domes 98 displace the die attach epoxy layer 100 in regions directly adjacent to the bottom surface of the chip 102, thereby reducing the amount of die attach material between the thermal posts and the chip 102 and increasing thermal transfer efficiency in the event that the die attach material is thermally insulative rather than thermally conductive. Because of the domes 98, any bubbles or voids in the die attach layer 100 are most likely displaced at the regions of the domes 98 and do not interfere with efficient thermal transfer.

Other techniques may be employed to form the solid post vias as a final process in accordance with the principles of the present invention. For example, after the holes 84 are drilled, a thin metal coating may be formed on the sidewalls by sputter deposition. A suitable metal solder may then be placed into the plated hole to fill it.

Advantageously, the highly efficient solid post thermal vias 96 may be placed in thermal via islands as shown in FIG. 8, thereby increasing the space under the integrated circuit die for routing channels.

The advantages of the present method become readily apparent when it is realized that instead of iterative, multi-step processes as previously required, the present invention requires only two steps. These steps are shown in FIG. 15. After formation of the multi-chip module with its multiple layers, the first step is to define the holes by a suitable drilling or other known method at a step 103. Then, the posts are plated up in a single process step 105 to complete the formation.

To those skilled in the art, many changes and modifications will be readily apparent from consideration of the foregoing description of a preferred embodiment without departure from the spirit of the present invention, the scope thereof being more particularly pointed out by the following claims. The descriptions herein and the disclosures hereof are presented by way of illustration only and should not be construed as limiting the scope of the present invention.

What is claimed is:

1. A non-iterative method for forming thermal post vias within a formed multi-layer, high density interconnect module including a base means, a ground plane metal layer formed upon the base, and plural layers of metal conductors separated by dielectric material, comprising the steps of:
   removing in a single step dielectric material to the ground plane metal layer at predetermined sites of said thermal post vias to define substantially cylindrical post holes,
   undercutting the ground plane metal layer to define a widened space thereat; and
   forming said thermal post vias by placing solid metal into said post holes.

2. The method set forth in claim 1 wherein said step of forming said thermal post vias is carried out by a single metal plating process step.

3. The method set forth in claim 2 wherein the single metal plating process step comprises electroplating.

4. The method set forth in claim 2 wherein the single metal plating process step comprises electroless plating and further comprises the step of chemically activating the post holes.

5. The method set forth in claim 1 wherein the step of forming said thermal post vias is carried out by the steps of depositing a metal coating upon exposed walls defining said post holes to form plated holes, and placing metal in liquid state into said plated holes.

6. The method set forth in claim 5 wherein said step of depositing a metal coating is carried out by sputtering.

7. The method set forth in claim 5 wherein said metal in liquid state comprises a solder.

8. The method set forth in claim 1 wherein the step of forming said metal post vias further comprises forming done means at an upper ends thereof, said dome means for aiding removal of voids in a die attach medium when an integrated circuit die is attached to said module over said thermal post vias.

9. The method set forth in claim 1 wherein the step of removing in a single step dielectric material at predetermined sites of said thermal post vias is carried out at plural predetermined via island areas underlying an integrated circuit die to be attached to the module.

* * * * *